(12) United States Patent
Tsang

(10) Patent No.: US 8,558,261 B2
(45) Date of Patent: Oct. 15, 2013

(54) LIGHT EMITTING CHIP AND METHOD FOR MANUFACTURING THE SAME

(75) Inventor: Jian-Shihn Tsang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 23 days.

(21) Appl. No.: 12/982,910

(22) Filed: Dec. 31, 2010

(65) Prior Publication Data

US 2012/0146070 A1   Jun. 14, 2012

(30) Foreign Application Priority Data

Dec. 13, 2010   (TW) ................................ 99143472 A

(51) Int. Cl.
*H01L 33/00*   (2010.01)
(52) U.S. Cl.
USPC .................... 257/98; 257/79; 438/22; 438/29
(58) Field of Classification Search
USPC ................. 257/40, 79, 98, 99; 438/22, 29, 63
See application file for complete search history.

(56) References Cited

U.S. PATENT DOCUMENTS

| 7,915,620 B2* | 3/2011 | Ishida et al. ..................... 257/79 |
| 8,004,000 B2* | 8/2011 | Min et al. ......................... 257/98 |
| 2003/0116770 A1 | 6/2003 | Chang et al. |
| 2009/0072408 A1 | 3/2009 | Kabir et al. |
| 2010/0171094 A1* | 7/2010 | Lu et al. .......................... 257/13 |

FOREIGN PATENT DOCUMENTS

| TW | 513820 | 12/2002 |
| TW | 200913105 A | 3/2009 |

* cited by examiner

*Primary Examiner* — Kimberly Rizkallah
*Assistant Examiner* — Errol Fernandes
(74) *Attorney, Agent, or Firm* — Altis Law Group, Inc.

(57) ABSTRACT

A light emitting chip includes a substrate, a heat conducting layer formed on the substrate, a protective layer formed on the heat conducting layer, a light emitting structure and a connecting layer connecting the protective layer with the light emitting structure. The heat conducting layer includes a plurality of horizontally grown carbon nanotube islands. The light emitting structure includes a first semiconductor layer, a light emitting layer and a second semiconductor layer. A first transparent conductive layer and a current conducting layer are sandwiched between the first semiconductor layer and the connecting layer. A second transparent conductive layer is formed on the second semiconductor layer.

4 Claims, 4 Drawing Sheets

LIGHT EMITTING CHIP AND METHOD FOR MANUFACTURING THE SAME

BACKGROUND

1. Technical Field

The present disclosure relates to a light emitting chip and a method for manufacturing the light emitting chip, and more particularly, to a light emitting chip having carbon nanotube for increasing heat dissipation capability thereof.

2. Description of Related Art

As new type light source, LEDs are widely used in various applications. An LED often includes an LED chip to emit light. A conventional LED chip includes a substrate, an N-type semiconductor layer, a light-emitting layer and a P-type semiconductor layer sequentially grown on the substrate. The substrate is generally made of sapphire ($Al_2O_3$) for providing the growing environment for the semiconductor layers. However, such sapphire substrate has a low heat conductive capability, causing that heat generated by the semiconductor layers cannot be timely and effectively dissipated.

What is needed, therefore, is a light emitting chip and a method for manufacturing the light emitting chip which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
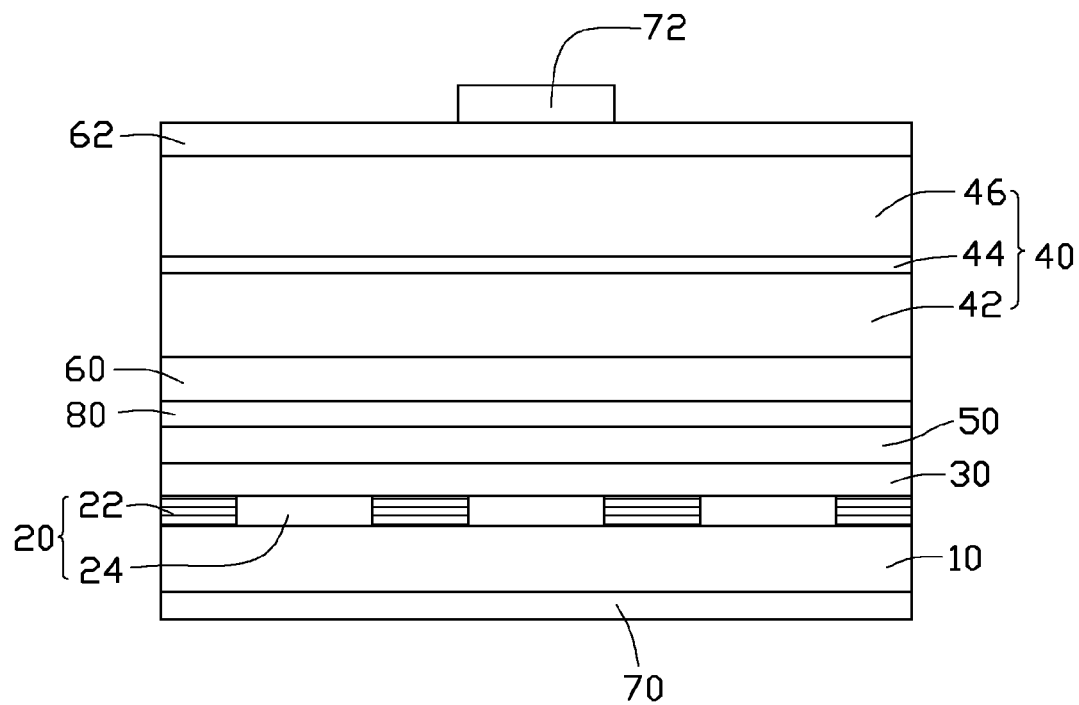
FIG. 1 shows a light emitting chip in accordance with a first embodiment of the present disclosure.

Referring to FIG. 1, a light emitting chip in accordance with a first embodiment of the present disclosure is disclosed. The light emitting chip includes a substrate 10, a heat conducting layer 20 formed on the substrate 10, a protective layer 30 formed on the heat conducting layer 20, a light emitting structure 40 and a connecting layer 50 connecting the protective layer 30 with the light emitting structure 40.

The substrate 10 may be made of sapphire, SiC, Si, GaN or other suitable materials. Preferably, the substrate 10 is made of heat conductive materials such as SiC, Si or GaN in this embodiment, for increasing heat dissipation capability of the light emitting chip. The heat conductive layer 20 includes a catalyst layer 24 and a carbon nanotube layer 22. The material of the catalyst layer 24 may be selected from Fe, Co, Ni, Mo or other suitable transition metals. The catalyst layer 24 is used for providing growing medium for the carbon nanotube layer 22. The catalyst layer 24 can be grown on a top face of the substrate 10 via MOCVD (Metal-Organic Chemical Vapor Deposition) or other suitable methods. The catalyst layer 24 forms a plurality of areas on the substrate 10 which are spaced from each other by multiple gaps. The carbon nanotube layer 22 is horizontally grown from the catalyst layer 24 by reaction of a gas combination containing $CH_4$, $H_2$, $N_2$ and Ar on lateral sides of the areas of the catalyst layer 24. The carbon nanotube layer 22 has a plurality islands received in the gaps between the areas of the catalyst layer 24, respectively. The islands of the carbon nanotube layer 22 are alternate with the areas of the catalyst layer 24. Each island of the carbon nanotube layer 22 is extended from a lateral side of a corresponding area to an opposite lateral side of an adjacent area of the catalyst layer 24 so that the whole heat conducting layer 20 is continuous along a horizontal direction.

The protective layer 30 is formed on a top face of the heat conducting layer 20 by deposition, sputtering or smearing. The protective layer 30 may be made of metal, transparent metal oxide or transparent glue. The protective layer 30 can protect the heat conducting layer 20 from damage during the subsequent steps of the manufacturing process of the light emitting chip.

The light emitting structure 40 includes a first semiconductor layer 42, a light emitting layer 44 and a second semiconductor layer 46. In this embodiment, the first semiconductor layer 42 is a P-type GaN layer, the second semiconductor layer 46 is an N-type GaN layer, and the light emitting layer 44 is a multi-quantum well GaN layer. The light emitting structure 40 is grown on a temporary substrate (not shown) by sequentially forming the second semiconductor layer 46, the light emitting layer 44 and the first semiconductor layer 42, and then connected to the protective layer 30 via the connecting layer 50 in an inverted manner so that the first semiconductor layer 42 is close to the protective layer 30. The temporary substrate is removed from the second semiconductor layer 46 by laser or milling to expose the second semiconductor layer 46.

A first transparent conductive layer 60 and a second transparent conductive layer 62 are formed on a bottom face of the first semiconductor layer 42 and a top face of the second semiconductor layer 46, respectively. The first and second transparent conductive layers 60, 62 may be made of ITO (Indium Tin Oxide) or an alloy of Ni/Au. The first and second transparent conductive layers 60, 62 can distribute current to uniformly flow through the first and second semiconductor layers 42, 46, respectively. The first transparent conductive layer 60 further forms a current conducting layer 80 on a bottom face thereof for transferring the current within the light emitting chip. The current conducting layer 80 may be made of metal having high reflective index, such as Au or Ag, for reflecting light downwardly emitted from the light emitting layer 44 towards the second transparent conductive layer 62, thereby increasing light-extracting efficiency of the light emitting chip. Alternatively, the current conducting layer 80 can also be in the form of electrically conductive DBR (Distributed Bragg Reflector) which is made by alternating multiple high refractive layers with multiple low refractive layers. The DBR layer can have a relatively high reflective efficiency approximate to 99% so that much more light can be reflected back towards the second transparent conductive layer 62. The second transparent conductive layer 62 forms a second electrode 72 on a top face thereof, and the substrate 10 forms a first electrode 70 on a bottom face thereof. The first electrode 70 and the second electrode 72 are used to join with other electrical structures (such as golden wires) to electrically connect the light emitting chip with the other electrical structures.

The connecting layer 50 is interposed between the current conducting layer 80 and the protective layer 30 to attach the light emitting structure 40 to the heat conducting layer 20. The connecting layer 50 may be made of metal, transparent metal oxide or transparent glue which is electrically conductive. As the light emitting structure 40 is bonded to the heat conducting layer 20 via the connecting layer 50, a current flowing pathway from the first electrode 70 sequentially through the substrate 10, the heat conducting layer 20, the protective layer 30, the connecting layer 50, the current conducting layer 80, the first transparent conductive layer 60, the first semiconductor layer 42, the light emitting layer 44, the second semiconductor layer 46 and the second transparent layer 62 to the second electrode 72, is formed.

Since the carbon nanotube has a relatively high heat conductive index more than 2000 W/m.K, the heat generated by the light emitting layer 44 can be effectively dissipated by the carbon nanotube layer 22. Furthermore, the horizontal grown carbon nanotube layer 22 can uniformly distribute the heat over the whole substrate 10, thereby preventing the heat from concentrated on particular points of the substrate 10.

A method for manufacturing the light emitting chip is also disclosed, includes steps:

providing a substrate 10;

forming a heat conducting layer 20 on the substrate 10, wherein the heat conducting layer 20 includes a plurality of catalyst areas 24 alternating with a plurality of carbon nanotube islands 22;

forming a protective layer 30 on the heat conducting layer 20;

attaching a light emitting structure 40 on the protective layer 30 via a connecting layer 50, wherein the light emitting structure 40 includes a first semiconductor layer 42, a light emitting layer 44 and a second semiconductor layer 46 with a first transparent conductive layer 60 and a second transparent conductive layer 62 formed on the first semiconductor layer 42 and the second semiconductor layer 46, respectively;

forming a first electrode 70 and a second electrode 72 on the substrate 10 and the second transparent conductive layer 62, respectively.

Figure 2:
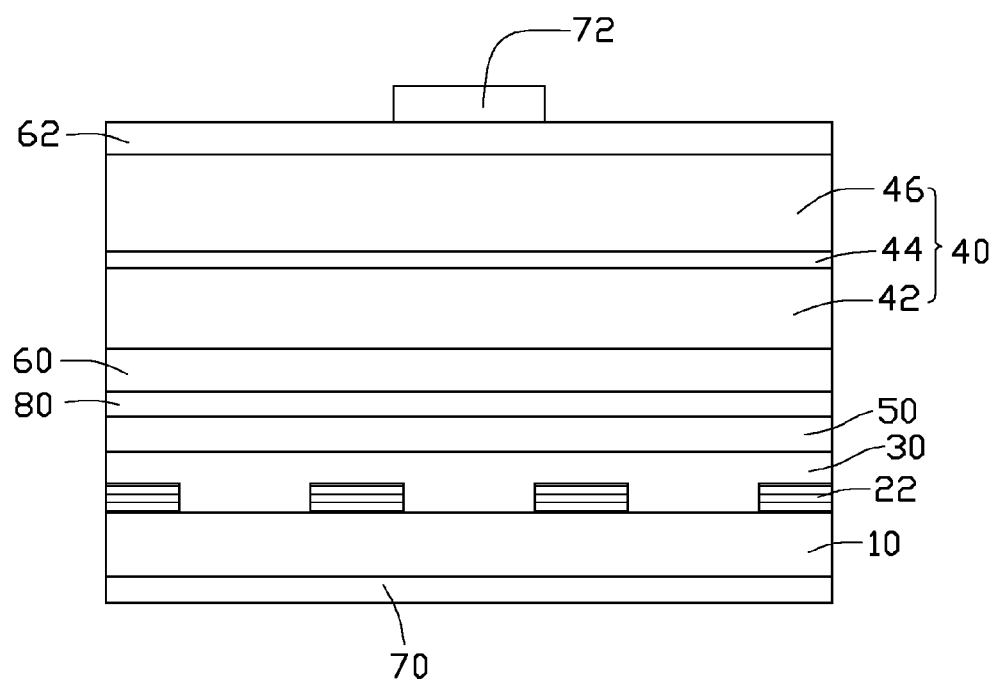
FIG. 2 shows a light emitting chip in accordance with a second embodiment of the present disclosure.

Alternatively, the catalyst layer 24 can be removed after growing the carbon nanotube layer 22 thereon so that the protective layer 30 can fill spaces between the islands of the carbon nanotube layer 22. FIG. 2 shows a light emitting chip of a second embodiment of the present disclosure without the catalyst layer 24. The heat conducting layer 20 becomes discrete after the catalyst layer 24 being removed. The protective layer 30 has lower ends filling between the islands of the carbon nanotube layer 24. By this way, the protective layer 30 of this embodiment can more reliably and securely protect the carbon nanotube layer 24. Furthermore, the carbon nanotube layer 22 can be directly grown on the top face of the substrate 10 in the form of islands by controlling particular lattice panels of the substrate 10, whereby the process of removing the catalyst layer 24 can be omitted.

Figure 3:
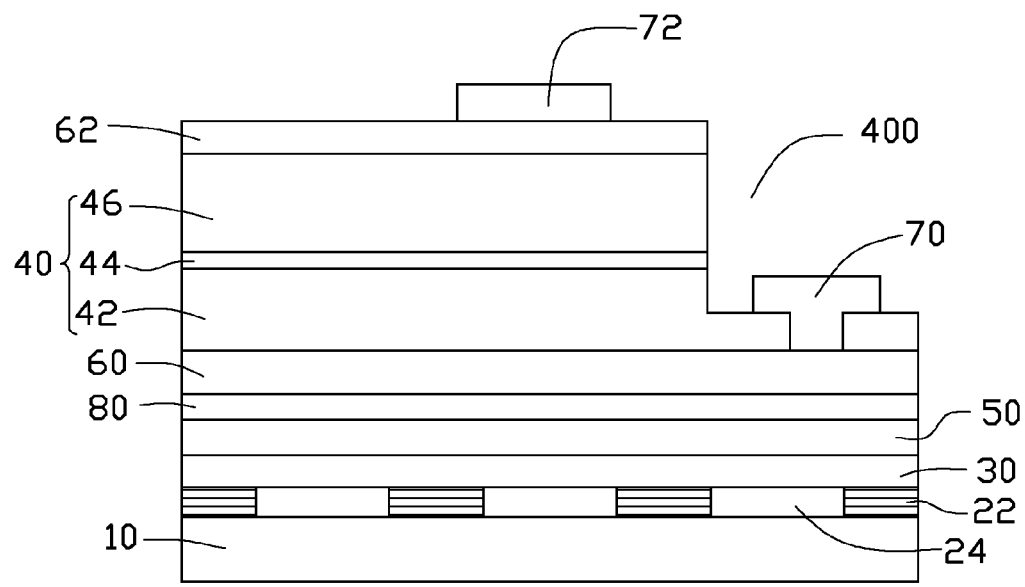
FIG. 3 shows a light emitting chip in accordance with a third embodiment of the present disclosure.
Figure 4:
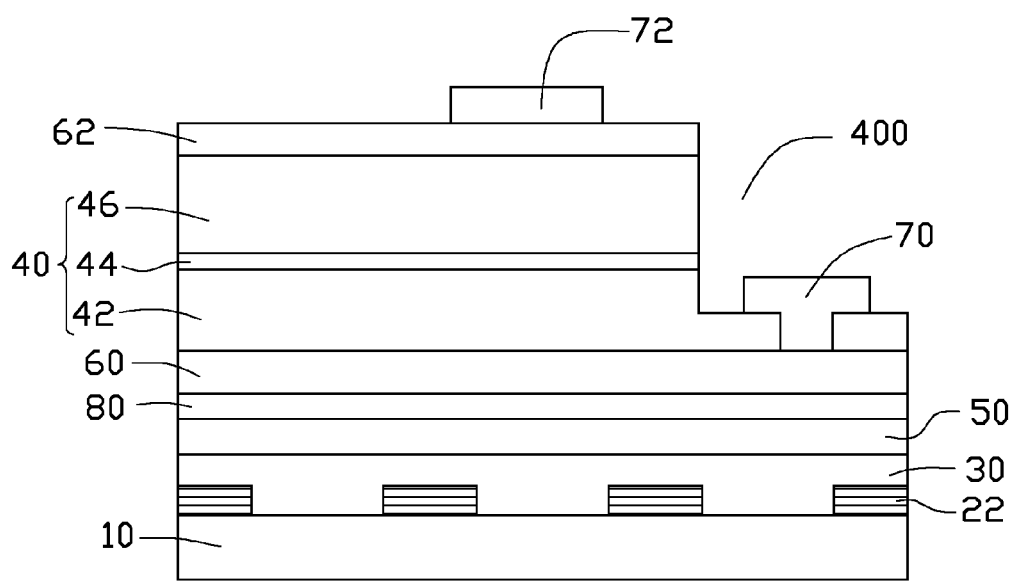
FIG. 4 shows a light emitting chip in accordance with a forth embodiment of the present disclosure.

The substrate 10 of the light emitting chip in the two embodiments is electrically conductive, whereby the first electrode 70 can be made on the bottom face of the substrate 10. However, when the substrate 10 is made of electrically nonconductive materials such as sapphire, the first electrode 70 cannot be formed on the substrate 10 and should be placed to other positions of the light emitting chip for ensuring continuous current conduction within the light emitting chip. FIG. 3 shows a light emitting chip in accordance with a third embodiment of the present disclosure which has a nonconductive substrate 10. The light emitting chip has a structure similar to that of the first embodiment except a location of the first electrode 70. The light emitting chip is etched to form a recess 400 in a lateral side thereof to expose the first semiconductor layer 42 and the first transparent conductive layer 60. The first electrode 70 is directly made on the first semiconductor layer 42 and connected to the first transparent conductive layer 60. Alternatively, the light emitting chip of the second embodiment can also be changed to have the first electrode 70 directly connected to the first semiconductor layer 42 and the first transparent conductive layer 60 as that shown in FIG. 4, when the substrate 10 is made of electrically nonconductive material.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A light emitting chip comprising:
   a substrate;
   a heat conducting layer formed on the substrate;
   a light emitting structure connected to the heat conducting layer, the light emitting structure comprising a first semiconductor layer, a light emitting layer and a second semiconductor layer; and
   a protective layer;
   wherein the heat conducting layer comprises a carbon nanotube layer;
   wherein the protective layer is directly formed on and connected to the carbon nanotube layer, the light emitting structure being connected to the protective layer via a connecting layer;
   wherein the carbon nanotube layer comprises a plurality of discrete islands on the substrate; and
   wherein the heat conducting layer comprises a catalyst layer, the catalyst layer has a plurality of areas spaced from each other by multiple gaps.

2. The light emitting chip as claimed in claim 1, wherein the islands of the carbon nanotube layer are received in the gaps between the areas of the catalyst layer, respectively.

3. A method for manufacturing a light emitting chip, comprising steps:
   providing a substrate;
   forming a heat conducting layer on the substrate;
   forming a protective layer; and
   connecting a light emitting structure to the heat conducting layer via a connecting layer, the light emitting structure comprising a first semiconductor layer, a second semiconductor layer and a light emitting layer located between the first semiconductor layer and the second semiconductor layer;
   wherein the heat conducting layer comprises a carbon nanotube layer;
   wherein the protective layer is directly formed on and connected to the carbon nanotube layer, the connecting layer being located between the light emitting structure and the protective layer;
   wherein the carbon nanotube layer is grown horizontally and has a plurality of discrete islands located on the substrate; and
   wherein the heat conducting layer comprises a catalyst layer, the catalyst layer has a plurality of areas spaced from each other by multiple gaps.

4. The method as claimed in claim 3, wherein the protective layer has lower portions received between the discrete islands of the carbon nanotube layer and an upper portion overlaying the discrete islands of the carbon nanotube layer.

\* \* \* \* \*